(12) United States Patent
Cioffi

(10) Patent No.: US 7,639,596 B2
(45) Date of Patent: Dec. 29, 2009

(54) HIGH SPEED MULTIPLE LOOP DSL SYSTEM

(75) Inventor: John M. Cioffi, Atherton, CA (US)

(73) Assignee: Adaptive Spectrum and Signal Alignment, Inc., Redwood City, CA (US)

( * ) Notice: Subject to any disclaimer, the term of this patent is extended or adjusted under 35 U.S.C. 154(b) by 848 days.

(21) Appl. No.: 10/808,771

(22) Filed: Mar. 25, 2004

(65) Prior Publication Data

US 2005/0152385 A1 Jul. 14, 2005

Related U.S. Application Data

(60) Provisional application No. 60/527,853, filed on Dec. 7, 2003.

(51) Int. Cl.
*H04J 1/12* (2006.01)
(52) U.S. Cl. .................. 370/201; 370/286; 379/406.01
(58) Field of Classification Search .................. 370/201,
370/351, 352, 420, 252, 286, 432, 464, 493,
370/494, 495, 535, 536, 267, 268, 269, 270,
370/431; 379/165, 164, 171, 198, 387.01,
379/399.01, 402, 413.02, 413.03, 1.03, 93.01,
379/416, 406; 455/91; 375/141, 157, 224,
375/225, 346, 222, 231
See application file for complete search history.

(56) References Cited

U.S. PATENT DOCUMENTS 4,177,464 A * 12/1979 Masak .................... 342/380

(Continued)

FOREIGN PATENT DOCUMENTS

EP 1 009 154 A2 6/2000

(Continued)

OTHER PUBLICATIONS

International Search Report, International Application No. PCT/IB2005/000714 (3 pgs).

(Continued)

*Primary Examiner*—Aung S Moe
*Assistant Examiner*—Abdullah Riyami
(74) *Attorney, Agent, or Firm*—Blakely, Sokoloff, Taylor & Zafman LLP

(57) ABSTRACT

A DSL system includes a multiple loop segment where K loops are bonded to provide a multiple loop segment having up to (2K−1) communication channels on which transmissions are vectored. The segment may be a drop to a customer premises, an inter-pedestal link, or any other suitable part of a larger DSL system. Generally the bonded loops are relatively short, being 300 meters or less. Signal vectoring is used to increase the speed and data carrying capability of the channels. In some embodiments, an expanded frequency spectrum also can be used to increase the data carrying capability of one or more of the channels. An impedance matching circuit may be coupled to each end of the segment to provided efficient transmission of data across the segment. A controller may provide control signals used to operate the segment as a vectored system and, if desired, frequency bandwidth control signals. The controller may monitor and/or collect data and information from the DSL system to assist in generating control signals. The controller can be a dynamic spectrum manager or DSM Center that includes a computer system and/or other hardware to assist in performing the required functions.

36 Claims, 8 Drawing Sheets

U.S. PATENT DOCUMENTS

| | | | | |
|---|---|---|---|---|
| 4,392,220 | A * | 7/1983 | Hirosaki et al. | 370/479 |
| 5,172,229 | A * | 12/1992 | Baker | 348/186 |
| 5,181,198 | A * | 1/1993 | Lechleider | 370/286 |
| 5,799,183 | A * | 8/1998 | Iwashita | 707/2 |
| 5,901,205 | A | 5/1999 | Smith et al. | |
| 6,147,963 | A | 11/2000 | Walker et al. | |
| 6,507,608 | B1 | 1/2003 | Norrell | |
| 6,535,552 | B1 * | 3/2003 | Pessoa | 375/231 |
| 6,678,375 | B1 * | 1/2004 | Henderson et al. | 379/397 |
| 6,901,530 | B2 * | 5/2005 | Cerami et al. | 714/4 |
| 6,952,441 | B2 * | 10/2005 | Peeters | 375/222 |
| 7,035,323 | B1 * | 4/2006 | Arato et al. | 375/222 |
| 7,058,707 | B1 * | 6/2006 | Cerami et al. | 709/223 |
| 7,106,833 | B2 * | 9/2006 | Kerpez | 379/1.03 |
| 7,158,563 | B2 * | 1/2007 | Ginis et al. | 375/224 |
| 2002/0010866 | A1 * | 1/2002 | McCullough et al. | 713/201 |
| 2002/0041565 | A1 * | 4/2002 | Valenti et al. | 370/201 |
| 2002/0181458 | A1 * | 12/2002 | Amidan et al. | 370/389 |
| 2003/0048802 | A1 * | 3/2003 | Shenoi | 370/458 |
| 2003/0086514 | A1 * | 5/2003 | Ginis et al. | 375/346 |
| 2003/0091053 | A1 * | 5/2003 | Tzannes et al. | 370/395.1 |
| 2003/0108063 | A1 * | 6/2003 | Joseph et al. | 370/465 |
| 2004/0076166 | A1 * | 4/2004 | Patenaude | 370/401 |
| 2004/0076222 | A1 * | 4/2004 | De Francesco et al. | 375/141 |
| 2004/0109546 | A1 * | 6/2004 | Fishman | 379/93.01 |
| 2004/0114751 | A1 * | 6/2004 | Tomilson | 379/399.01 |
| 2004/0146072 | A1 * | 7/2004 | Farmwald | 370/537 |
| 2004/0157566 | A1 * | 8/2004 | Fishman | 455/91 |
| 2004/0223500 | A1 * | 11/2004 | Sanderson et al. | 370/395.53 |
| 2005/0013379 | A1 * | 1/2005 | Duvaut et al. | 375/259 |
| 2005/0053229 | A1 | 3/2005 | Tsatsanis et al. | |
| 2005/0105473 | A1 * | 5/2005 | Hausman et al. | 370/249 |
| 2005/0201379 | A1 * | 9/2005 | Zhang et al. | 370/395.1 |
| 2006/0056522 | A1 * | 3/2006 | Tsatsanis et al. | 375/257 |
| 2006/0098725 | A1 * | 5/2006 | Rhee et al. | 375/222 |
| 2006/0109779 | A1 * | 5/2006 | Shah et al. | 370/201 |
| 2006/0114977 | A1 * | 6/2006 | Ginis et al. | 375/222 |
| 2006/0171480 | A1 * | 8/2006 | Erving et al. | 375/260 |
| 2006/0280238 | A1 * | 12/2006 | Cioffi et al. | 375/222 |
| 2006/0291581 | A1 * | 12/2006 | Onggosanusi et al. | 375/267 |
| 2007/0019681 | A1 * | 1/2007 | Wang | 370/493 |
| 2007/0036207 | A1 * | 2/2007 | Wang | 375/222 |
| 2007/0081582 | A1 * | 4/2007 | Ginis et al. | 375/222 |
| 2008/0056484 | A1 * | 3/2008 | Fortier | 379/416 |
| 2008/0071516 | A1 * | 3/2008 | Cioffi et al. | 703/21 |

FOREIGN PATENT DOCUMENTS

| | | |
|---|---|---|
| WO | WO 94/18781 A1 | 8/1994 |
| WO | WO 95/31867 A1 | 11/1995 |
| WO | WO 03/105339 A1 | 12/2003 |

OTHER PUBLICATIONS

Written Opinion of the International Searching Authority, International Application No. PCT/ IB2005/000714 (5 pgs).

* cited by examiner

Using 8192 tones

7x7 Channel

| Line length | Speed |
|---|---|
| 50 m | 3379.456 Mbps |
| 100 m | 3292.700 Mbps |
| 150 m | 3086.508 Mbps |
| 200 m | 2860.460 Mbps |
| 250 m | 2622.604 Mbps |
| 300 m | 2430.580 Mbps |

4x4 Channel

| Line length | Speed |
|---|---|
| 50 m | 1835.644 Mbps |
| 100 m | 1851.464 Mbps |
| 150 m | 1831.016 Mbps |
| 200 m | 1714.832 Mbps |
| 250 m | 1555.568 Mbps |
| 300 m | 1389.960 Mbps |

Using 4096 tones

7x7 Channel

| Line length | Speed |
|---|---|
| 50 m | 1694.620 Mbps |
| 100 m | 1693.324 Mbps |
| 150 m | 1684.680 Mbps |
| 200 m | 1626.964 Mbps |
| 250 m | 1556.748 Mbps |
| 300 m | 1481.112 Mbps |

4x4 Channel

| Line length | Speed |
|---|---|
| 50 m | 927.272 Mbps |
| 100 m | 934.376 Mbps |
| 150 m | 939.040 Mbps |
| 200 m | 938.220 Mbps |
| 250 m | 934.188 Mbps |
| 300 m | 901.836 Mbps |

*Figure 7*

HIGH SPEED MULTIPLE LOOP DSL SYSTEM

CROSS-REFERENCE TO RELATED APPLICATIONS

This application claims the benefit of priority under 35 U.S.C. § 119(e) of U.S. Provisional No. 60/527,853 filed on Dec. 7, 2003, entitled DYNAMIC MANAGEMENT OF COMMUNICATION SYSTEM, the disclosure of which is incorporated herein by reference in its entirety for all purposes.

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING COMPACT DISK APPENDIX

Not applicable.

BACKGROUND OF THE INVENTION

1. Field of the Invention

This invention relates generally to methods, systems and apparatus for managing digital communications systems. More specifically, this invention relates to a DSL system using multiple loops in a coordinated manner to provide high speed communications.

2. Description of Related Art

Digital subscriber line (DSL) technologies provide potentially large bandwidth for digital communication over existing telephone subscriber lines (referred to as loops and/or the copper plant). Telephone subscriber lines can provide this bandwidth despite their original design for only voice-band analog communication. In particular, asymmetric DSL (ADSL) and very-high-speed DSL (VDSL) can adapt to the characteristics of the subscriber line by using a discrete multitone (DMT) line code that assigns a number of bits to each tone (or sub-carrier), which can be adjusted to channel conditions determined during initialization and subsequent on-line training known as "bit-swapping" of the modems (typically transceivers that function as both transmitters and receivers) at each end of the subscriber line.

Currently, VDSL2 systems can achieve data rates of up to approximately 150 Mbps on short loops and ADSL2+ systems can achieve data rates of up to approximately 25 Mbps on somewhat longer loops than VDSL. "Short loops" are loops in which the component wires are preferably approximately 100 meters or less, and certainly 300 meters or less. Higher data rates are generally prohibited due to the line attenuation, but on short loops are particularly limited by the maximum bandwidth used by the ADSL and VDSL modems and by frequency selective noises caused by crosstalk from other phone lines sharing the same cable, radio ingress, and a variety of customer-premises noises often known generically as impulse noise. These short loops are found at various points in a typical DSL plant.

Systems, methods and techniques that permit higher data rates without having to extend optical fiber and other high bandwidth materials to customer premises and the like would represent a significant advancement in the art.

BRIEF SUMMARY OF THE INVENTION

A high speed DSL system includes a multiple loop segment having K bonded loops providing up to (2K−1) communication channels. The segment may be a drop to a customer premises, an inter-pedestal link, or any other suitable part of a larger DSL system that has multiple loops that are available for bonding and vectored transmission of data. Generally the bonded loops are relatively short, being 300 meters or less.

Signal vectoring is used to increase the speed and data carrying capability of the channels. In some embodiments, an expanded frequency spectrum also can be used to increase the data carrying capability of one or more of the channels. An impedance matching circuit may be coupled to each end of the segment to provided efficient transmission of data across the segment.

Vectoring units can be connected to each end of the segment to provide vectored transmission and/or reception (that is, one-sided or two-sided vectoring). The vectoring units may house vector signal processing modules connected to the segment. The vectoring components can be hardware, software or a combination of both hardware and software, as appropriate. The vectoring units also may perform other signal processing such as filtering and digital-to-analog and analog-to-digital conversion and may include any impedance matching circuitry.

In some embodiments, a controller is configured to provide control signals used to operate a multiple loop segment as a vectored system. The controller also may provide frequency bandwidth control signals, in the event that an expanded frequency spectrum is used to improve data rates. The controller may monitor and/or collect data and information from the DSL system to assist in generating control signals. The controller can be a dynamic spectrum manager or DSM Center that includes a computer system and/or other hardware to assist in performing the required functions. In other embodiments, the DSL system may run independent of any controller or be pre-programmed to perform in a given vectoring mode.

The present invention can be used in ADSL, VDSL and other communication systems. The loops are bonded using an appropriate bonding protocol (for example, TDIM bonding, Ethernet bonding, ATM bonding or the G.bond protocol).

Methods of the present invention include bonding multiple DSL loops to provide a multiple loop segment having a number of communication channels, and vectoring transmissions across the bonded segment. Bonding and vectoring can be performed in various ways, as noted herein. These methods can be implemented in ADSL, VDSL and other communication systems.

Further details and advantages of the invention are provided in the following Detailed Description and the associated Figures.

BRIEF DESCRIPTION OF THE SEVERAL VIEWS OF THE DRAWING

The present invention will be readily understood by the following detailed description in conjunction with the accompanying drawings, wherein like reference numerals designate like structural elements, and in which:

FIG. 7 are tables showing test data using multiple DSL bonded and vectored loop segments using 4096 and 8192 tones in a DMT system.

DETAILED DESCRIPTION OF THE INVENTION

Figure 1:
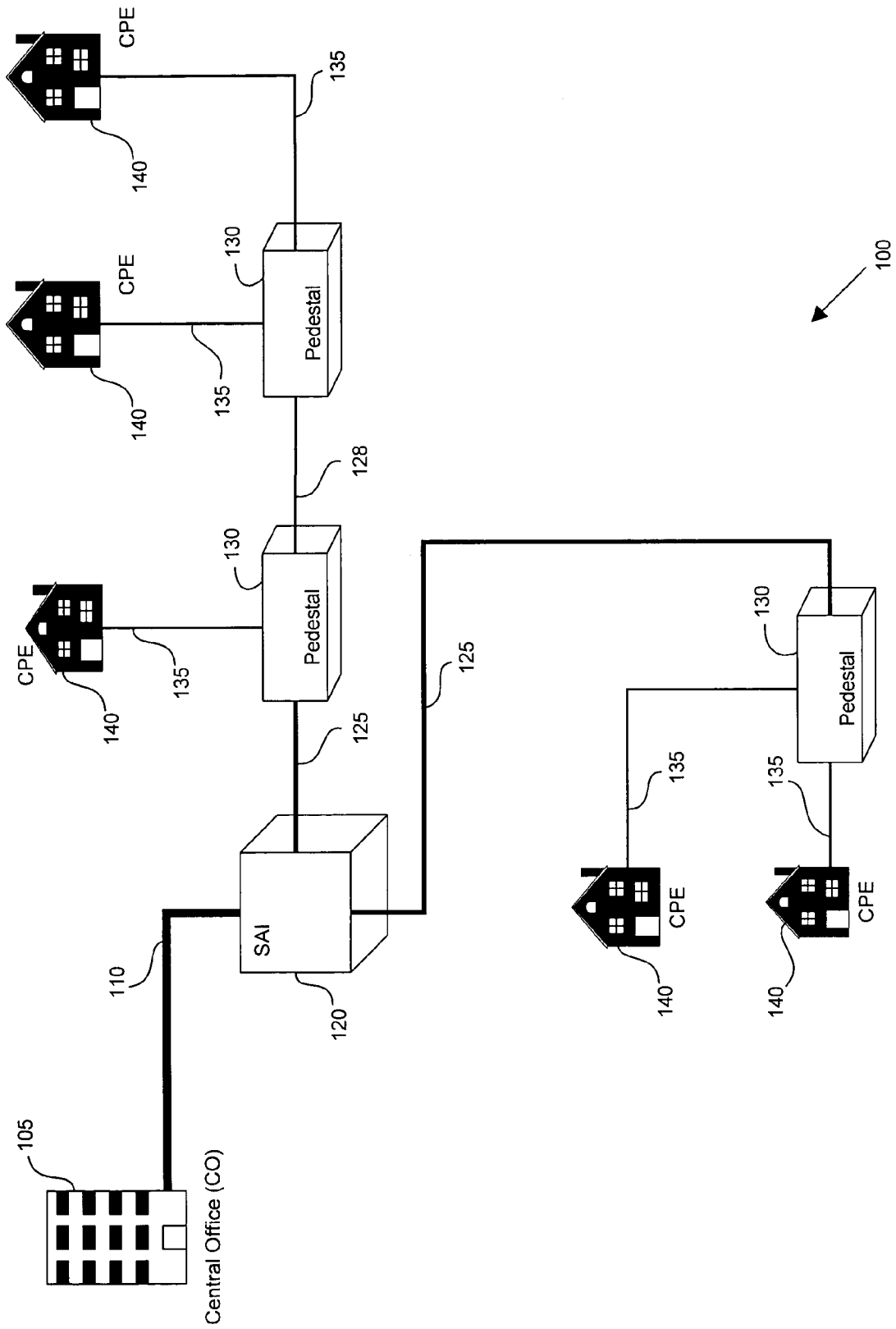
FIG. 1 is a diagram of a typical DSL plant.

The following detailed description of the invention will refer to one or more embodiments of the invention, but is not limited to such embodiments. Rather, the detailed description is intended only to be illustrative. Those skilled in the art will readily appreciate that the detailed description given herein with respect to the Figures is provided for explanatory purposes as the invention extends beyond these limited illustrative and exemplary embodiments.

The present invention leverages the use of multiple loops in a DSL system where the loops can be bonded and are short (though the present invention is not limited solely to short loops). Bonding the loops and vectoring the data transmission on the loops allows the creation and operation of a multiple channel system that typically can achieve data rates greater than the sum of the individual loops' data rates when operated as individual DSL loops.

The term subscriber loop or "loop" refers to the loop that is formed by the line that connects each subscriber or user to the central office (CO) of a telephone operator (or possibly a remote terminal (RT) of such an operator). A typical topology 100 of a DSL plant is presented in FIG. 1. As can be seen, a CO 105 provides high bandwidth transmission via a feeder 110 (which can be a high-bandwidth link, such as fiber optic cable, or a binder with a number of copper lines running through it). The feeder 110 may connect the CO 105 to a serving area interface (SAI) 120 (which may be an optical networking unit or ONU). From interface 120, a number of copper lines 125 may then extend to a pedestal 130 near one or more customer premises equipment (CPE) locations 140. Such pedestals are not uncommon on each block of a street or neighborhood, for example. In some cases, pedestals are intermediate points between a CO, SAI and/or other pedestals. For example, in FIG. 1, a inter-pedestal link 128 allows service for one CPE to be split off, while lines continue on to another pedestal and to one or more other CPEs.

Pedestals offer a cross connection point between lines going to a specific or a few customer premises (often referred to as a "drop") and the remainder of lines that may continue to other pedestals. Typically, there are 2-6 lines in the "drop" segment to each customer, providing extra copper for the contingency of one or more customers later demanding multiple phone services. The cable back to the ONU or central office usually does not have 2-6 times as many phone lines as would be needed by all the customers (because not all customers will demand that many phones). However, the pedestal drops typically have extra copper.

This extra copper is exploited in embodiments of the present invention when fiber or other high-bandwidth media passes to the pedestals and those pedestals are upgraded both to bond and vector electronically the lines in the drop segment to a customer (and thus interface that group of one customer's lines to the fiber or other high-bandwidth media passing to the pedestal). Those skilled in the art will recognize that, while the terms ONU and pedestal are used in examples discussed herein, many other equivalent names are used in the practice such as boxes, service terminals, cabinets, etc. and that embodiments of the present invention presented herein are equally applicable to all such locations. Furthermore, the continuing connection between pedestals could actually be in the nature of a repeater function, continuing service to other pedestals or connection points. In particular, the fiber could be a passive optical network, a multi-user sharing of a single fiber that would connect all the pedestals.

Connections to pedestals, if optical fiber, could be part of a passive optical network (PON), which would then have an Optical network terminal (ONT) at each pedestal, which functions logically as a T connection to a single fiber. In the future, an Ethernet PON (EPON) may have fiber running 10 Gbps and pedestal connections running several Gbps rates. Today, the recent EPON standard has a Gbps on the fiber and each ONT as 100 Mbps—that, too, could be used where pedestals only run at 100 Mbps.

Part of each subscriber loop may be collocated with the loops of other users within a multi-pair binder (or bundle). As seen in FIG. 1, after the pedestal 130, very close to the CPE 140, one or more loops take the form of a drop segment 135 that exits the bundle. The subscriber loop can thus traverse different environments. Part of it typically is located inside a binder, where the loop is shielded from external electromagnetic interference, but is subject to crosstalk, which is interference from other subscriber loops hosted by the binder. After the pedestal 130, the drop wire(s) 135 may or may not be affected by crosstalk, depending on distance from other pairs, but transmission also can be impaired due to electromagnetic interference because drop wires typically are unshielded.

As mentioned above, in most cases, multiple loops connect a pedestal (or other location) to a single CPE. In such cases, loops operated as independent loops have at least the following drawbacks:

First, despite being short loops (typically 100 meters or less, and almost always less than 300 meters), each single loop is limited as to the data rate it can carry by attenuation, etc., irrespective of noise, crosstalk and/or other interference from other nearby loops;

Second, when multiple loops are in the same drop, they can interfere with one another via crosstalk; and Third, each of these short loops would need connection to a loop back to the ONU or CO and there may not be a sufficient number of such loops available within the cable to provided sufficient connection for all customers if they used all their drop wires.

Figure 2:
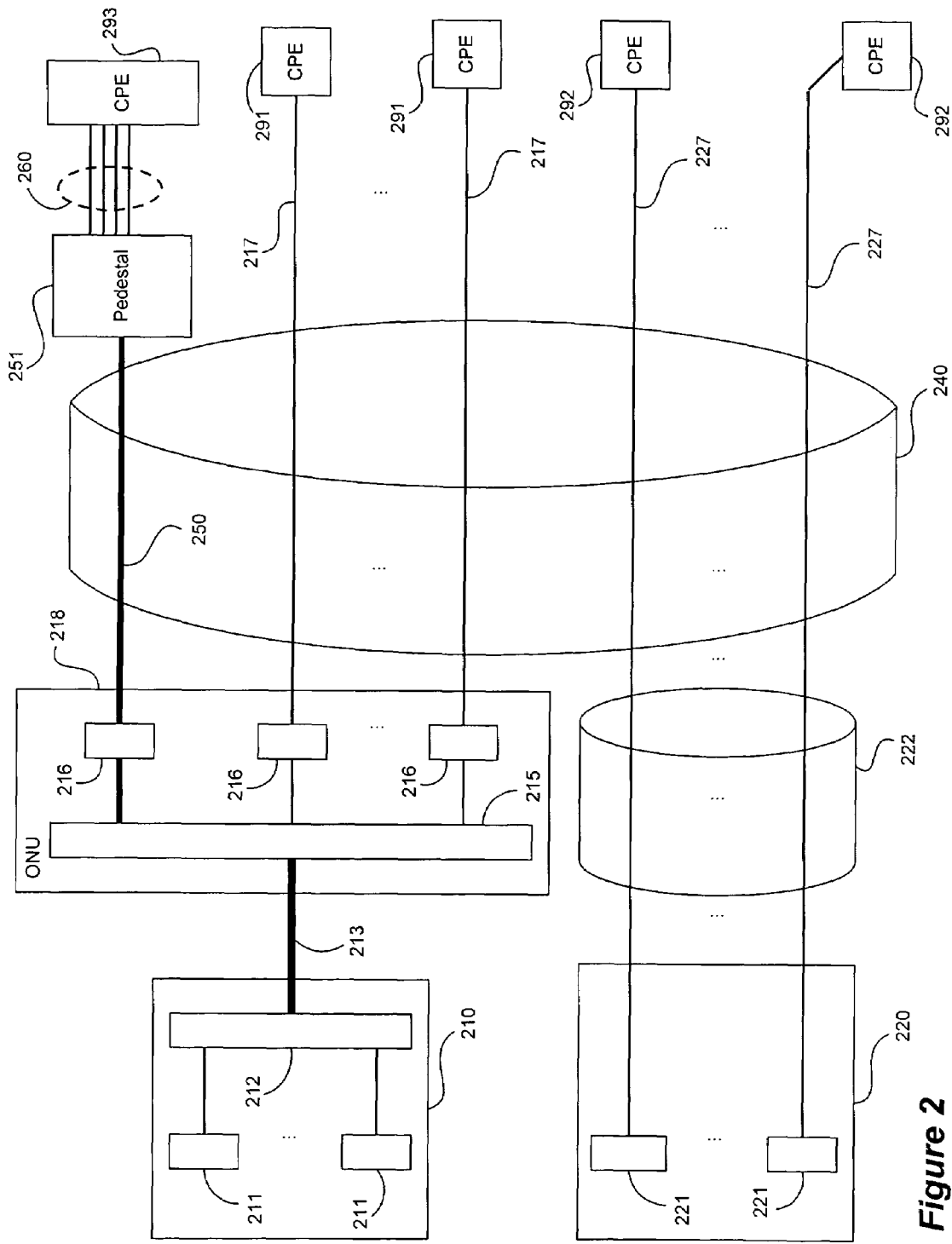
FIG. 2 is a schematic diagram showing a generic DSL deployment in which embodiments of the present invention can be used.

As seen in the generic DSL deployment shown in FIG. 2, two sources of data signals 210, 220 (for example, DSLAMs and the like) provide services to a number of users/CPEs 291, 292, 293 via a series of feeders and other communication lines 213, 217, 227, 250. In one case, a group of 4 loops 260 are dropped from pedestal 251 to CPE 293. The proximity of the loops 260 to one another likely gives rise to crosstalk. Also, the drop of loops 260 typically is unshielded. Embodiments of the present invention can use such a configuration, however, to not only reduce and/or virtually eliminate crosstalk problems, but also to significantly increase the data rate available to the CPE 293 and/or a group of CPEs coupled to the downstream end of the loops 260. The phrases "coupled to" and "connected to" and the like are used herein to describe a connection between two elements and/or components and are intended to mean coupled either directly together, or indirectly, for example via one or more intervening elements.

Figure 3:
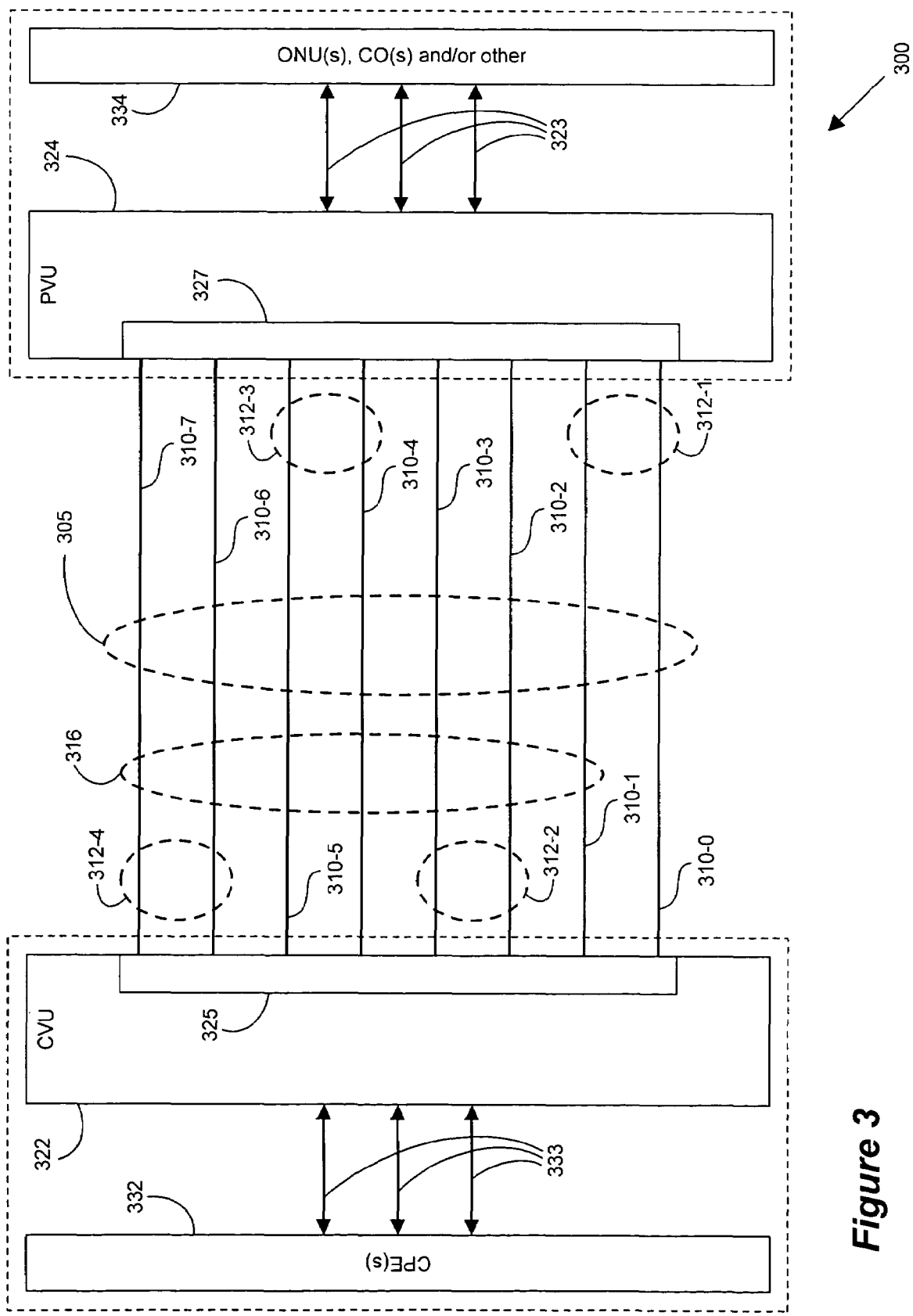
FIG. 3 is a schematic block diagram showing the relevant portions of a DSL system implementing one or more methods, systems and/or other embodiments of the present invention.
Figure 4:
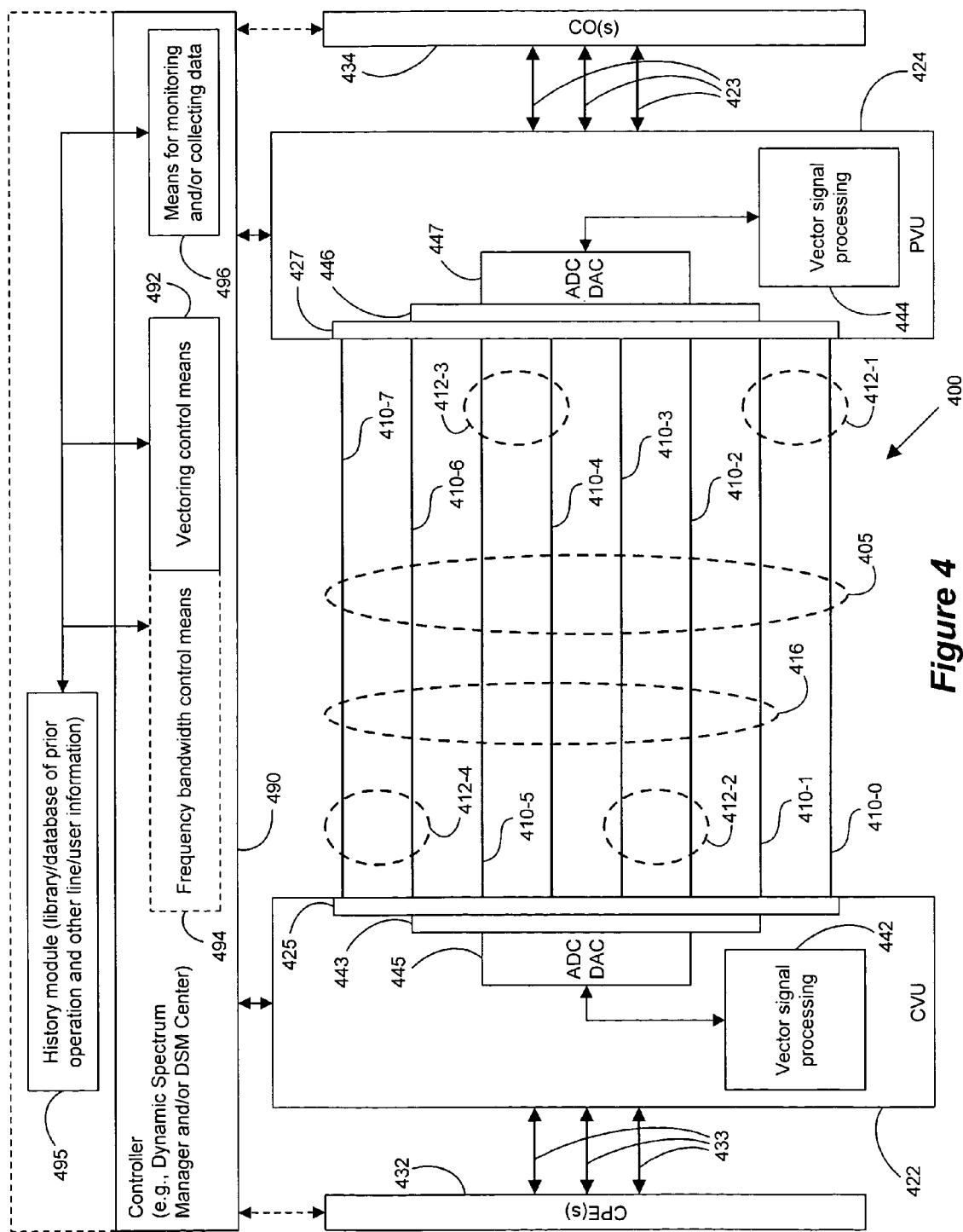
FIG. 4 is a schematic block diagram showing the relevant portions of another DSL system implementing one or more methods, systems and/or other embodiments of the present invention.

FIGS. 3 and 4 show examples of the system of FIG. 2 using embodiments of the present invention. These Figures illustrate both structural and apparatus embodiments of the present invention, as well as method embodiments of the present invention. In the following discussion, examples using 4 loops will be presented, though embodiments of the present invention can use 2, 3, 4 or more loops in the systems, methods and techniques described herein. Moreover, the multiple loop segments discussed herein may be referred to as "drops" for ease of explanation but, again, the present invention is not limited solely to drops from pedestal to CPE. The present invention may be applied in any suitable location or site in a DSL topology. For example, connections between pedestals can be converted to "supervectored" segments using embodiments of the present invention and coordinating, for example, 8-20 loops to carry several Gbps.

As noted above, drops from pedestals, pedestal links and the like are short loops to the CPE, typically 50-100 meters, and certainly less than 300 meters (though the present invention is not limited to short loops only). In FIG. 3, system 300 includes a multiple loop segment 305 comprised of 8 wires 310-0 through 310-7, which are the 8 wires from 4 loops 312-1 through 312-4 (similar to loops 260 of FIG. 2). Wires 310 are bonded using any suitable means or technique.

DSL bonding is line aggregation that combines multiple independent DSL loops into a single logical channel for high-speed transmission. There are several techniques known to those skilled in the art for implementing DSL Bonding. For example, DSL bonding can be done in conjunction with Copper Mountain's CopperEdge DSLAMs with Multilink Frame Relay technology implementation. This type of DSL bonding is also referred to as DSLAM-based DSL bonding. Another example is the industry standard Multilink PPP (MP), which is implemented in a customer's DSL router and the ISP's DSL subscriber management system or router (for example, Redback or Cisco). MP bonding creates a bonded or aggregated connection consisting of two or more independent DSL loops. DSL bonding over Multilink PPP (MP) requires the DSLAM be configured to support PPP. Using either of these DSL bonding techniques, multiple DSL loops can be aggregated to create a single logical data channel that is the sum of the individual lines' bandwidth, minus a small amount used for overhead. In addition to aggregating multiple DSL loops, both techniques perform automatic balancing of traffic across the links and actively monitor the performance of the bonded connection. Should one of the links fail for any reason, traffic is automatically forwarded to the active link. When the failed link is restored, the bonded connection is also transparently restored. From this perspective, DSL bonding not only provides increased bandwidth, but it also provides redundancy in the event of line failure.

Various protocols can be considered and implemented for bonding in embodiments of the present invention. For example, time division inverse multiplexing (TDIM bonding), Ethernet Transport for Single and Multiple Pair xDSL Systems (Ethernet bonding), and ATM-based multi-pair bonding (ATM bonding) are all well known to those skilled in the art and additional information regarding TDIM bonding can be found in publications from the American National Standard for Telecommunications. Moreover, the G.bond standard currently under consideration by the International Telecommunications Union also is known to those skilled in the art.

In the embodiment of the present invention shown in FIG. 3, bonding means that the lines 310 function as and include a reference wire (for example, wire 310-0) and a communication link 316 having 7 available channels, where anywhere from 1 to 7 of channels may be used (thus yielding a channel matrix having dimensions up to a 7×7 matrix), where the data rate to CPE(s) 332 in FIG. 3 is:

$$\text{Rate to/from } CPE(s) = \sum_{n=1}^{7} R_n$$

where $R_n$ is the data rate on the $n$th wire

In some embodiments of the present invention, vectoring can be used. Vectoring is a technique in which all DSL lines are synchronized in DMT symbol rate and crosstalk nominally is cancelled—in this invention, vectoring can also be used to increase the bandwidth by exploiting crosstalk between the individual wires. In effect, each of the 7 wires referenced to a common 8th wire presents an opportunity for transmission of useful data and any crosstalk between the 7 data bearing wires is cancelled via synchronized, coordinated transmission on the 7 channels created by bonding the 4 loops. Those skilled in the art will note that, in general, for a given number of loops K, the maximum number of channels available for data transmission is twice the number of loops minus one (that is, 2K−1). Further, not all channels need be excited nor all possible signals received, which can lead to a non-square channel transfer comprising from 1 to (2K−1) transmitters and from 1 to (2K−1) receivers. The number of transmitters and receivers need not be the same, but simply coordinated by vectoring since all are contributing to the overall data rate for the set of drop wires to an individual customer.

Techniques for use with the present invention are disclosed in more detail in United States Patent Application 20030086514, U.S. Ser. No. 09/877,724, filed by Ginis, Yu, Zeng and Cioffi on Jun. 8, 2001 and published by the USPTO on May 8, 2003, entitled "DYNAMIC DIGITAL COMMUNICATION SYSTEM CONTROL", which is incorporated herein by reference in its entirety for all purposes. Use of vectoring with the bonded wires 310 of the system 300 of FIG. 3 means that the signals transmitted on one or more of those 7 channels are coordinated to reduce and/or avoid crosstalk. Line 310-0 is the reference line and thus carries no data.

In the embodiment of the present invention shown in FIG. 3, vectoring is accomplished using a pair of vectoring units (VUs)—a Customer VU (CVU) 322 and a Pedestal VU (PVU) 324. A VU may be a computer system, module, modem, etc. and may include software, hardware or a combination of both software and hardware. The VUs provide vectored transmissions across the segment 305. CVU 322 may be located in a customer premises and is coupled to one or more CPE devices 332 (for example, computers, telephones, television sets and/or other devices) in any suitable manner. As indicated by the dashed lines in FIG. 3, the CVU 322 may or may not be part of or included in the CPE device(s) 332. The CVU 322 also can reside in a separate location and be coupled to the CPE device(s) 332 by one or more suitable communication links 333 (for example, wireless connections, Ethernet connections and/or other suitable connections). In some cases a single CPE device may be connected to segment 305 by CVU 322. The PVU 324 can be located within a pedestal or other device and is connected to the CO or ONU via fiber (PON or other), copper or other connection as suitably chosen by the service provider.

Substantial signal and/or data processing for the PVU 324 also can reside in a separate location (for example, a controller and/or an independent dynamic spectrum management (DSM) center, facility, location and/or entity) and be coupled to the PVU 324 by one or more suitable communication links 323. As will be appreciated by those skilled in the art, a controller such as a DSM center may also be coupled to the CVU 322 via element management (or "embedded operations) channels or over the internet itself (which may be carried through the bandwidth on the link). In the case of each VU, the VU may be coupled to some other type of user, operator, location, etc., rather than the CPE device(s) and/or service provider(s) illustrated in FIG. 3. In some embodiments, the VUs 322, 324 and any vectoring functionality in a controller coordinate reception of data at each end of the segment 305. In other embodiments, each VU 322, 324 coordinates both transmission and reception of data across segment 305. This coordination can include distributing data across the 7 channel link 316, detecting and eliminating crosstalk and managing data using the 7 channel matrix that can be determined by either VU 322, 324 or both in combination, perhaps assisted by a controller and/or dynamic spectrum manager, as discussed. Other vectoring functions will be known and appreciated by those skilled in the art.

Figure 5:
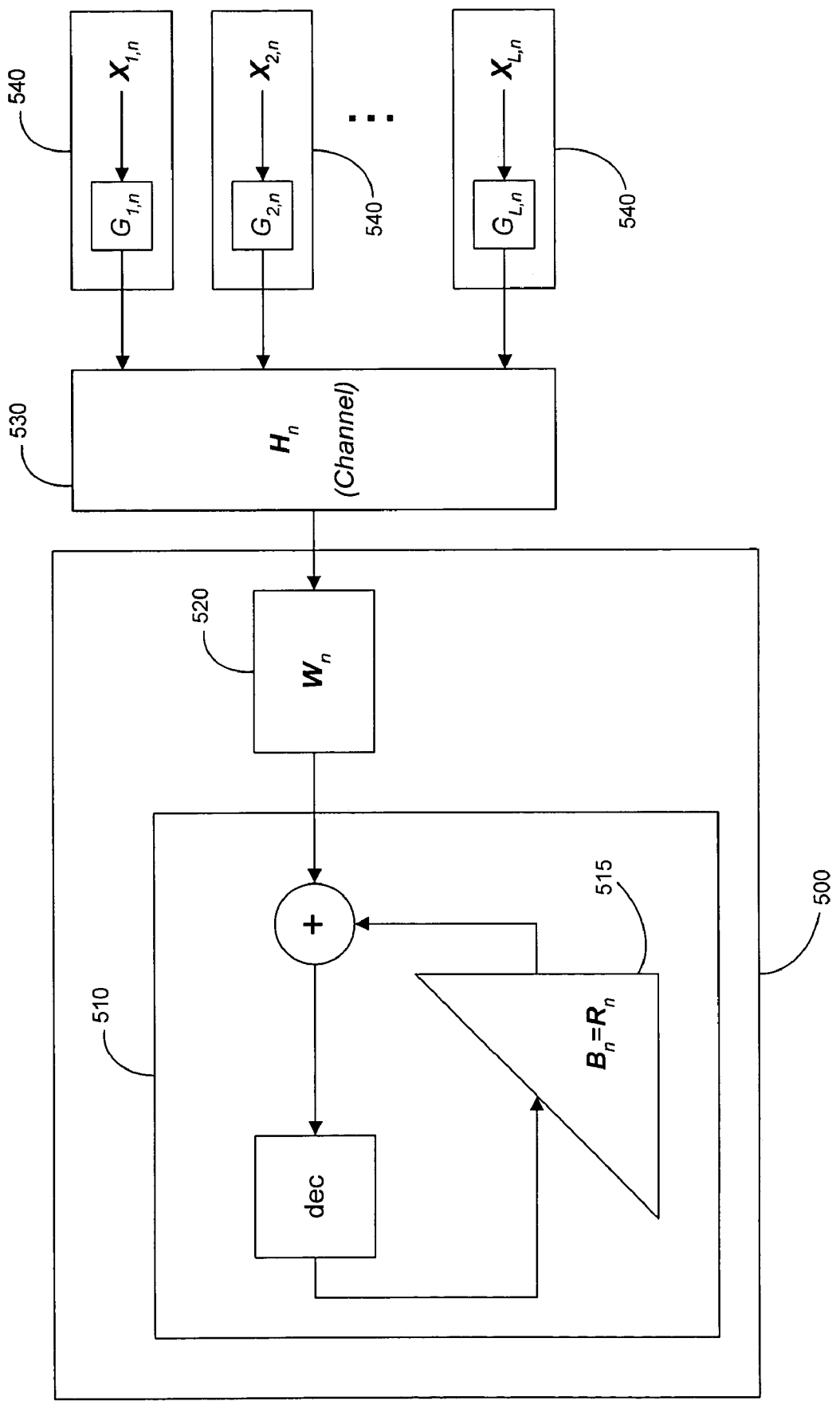
FIG. 5 is a schematic block diagram of a one-sided vectoring system implementable with embodiments of the present invention.

In cases where fewer than all available wires are used in both directions for data transmission, non-square vectoring may be employed. FIG. 5 is a block diagram illustrating a zero-forcing generalized decision feedback equalizer (ZF-GDFE) for the receiver 500 of either a CVU or PVU in embodiments of the present invention, where receiver 500 receives transmissions from transmitters 540 via a channel H 530. This particular structure is shown for digitally duplexed DMT (used, for example, in VDSL1 and VDSL2) with the symbol clocks for all lines synchronized. Such synchronization renders the FEXT crosstalk between the lines independent. The use of such a system is well known and covered, for example, in Chapter 11 of Understanding Digital Subscriber Lines (Starr, Sorbara, Cioffi, and Silverman, Prentice Hall, 2003), referred to as "Starr et al."

This one-sided structure is preferable to the two-sided "vector-coding" special case in many situations because that equivalent-performing structure also requires coordination at the transmit side. For example, using the two-sided vector-coding may be physically impossible where upstream transmissions originate from multiple CPEs using multiple loop segments of the present invention that terminate in the same pedestal. FEXT from these customers into one another in such a situation can be eliminated via the structure of FIG. 5. Nevertheless, two-sided vector-coding is may be appropriate for some embodiments of the present invention.

The (2K−1) wires of a channel/segment 530 of the present invention will form/produce a k×l matrix $H_n$, where k could be any integer 2, 3, . . . , 2K−1 and so could l. In the highest-data-rate case, k=l=2K−1. The tone index n is an integer n=1, . . . , 8192 for the advantageous embodiment where transmissions and in particular crosstalk are independent from tone to tone. The structure of FIG. 5 can be generalized to other modulation methods, but the matrix H then represents a potentially enormous coupling structure of much higher complexity (with no gain and usually a loss in performance).

For the one-sided-case shown in FIG. 5, the receiver is determined for each tone independently by a "QR" factorization of the matrix $H_n$ so that $$H_n = Q_n \cdot D_n \cdot R_n \quad (1)$$

where the $Q_n$ matrix is orthogonal, the $D_n$ matrix is diagonal k×l with zeroed entries to make it non-square when k≠n, and the $R_n$ matrix is triangular and monic. Such a computation might well be done for each tone by a controller such as a dynamic spectrum manager in DSM center, for example. Such a decomposition need not be square. The $H_n$ should include any noise-prewhitening factor, so this matrix is formed by multiplying the inverse of any square root of the measured noise spatial-autocorrelation matrix $S_n$ (this noise is all the noise from sources other than the (2K−1) lines) by the channel insertion loss matrix $Hlin_n$, so that $H_n = S_n^{-0.5} \cdot Hlin_n$. The receiver processing matrices are then determined from those of the factorization as shown in FIG. 5 (* denotes conjugate matrix transpose in the explanation of this illustrative example). The matrix $H_n$ can be any dimension for this procedure. The D matrix will be zero for non-excited input components, so these zero entries are actually also zeroed on the receive side (to avoid dividing by zero) when k>l or some spatial modes of transmission on any frequency are zero for any other reason. The receive matrix $W_n$ 520 in receiver 500, where $W_n = (D_n)^{-1} Q^*_n S^{-0.5}$, will be l×k, and the feedback matrix 515 of the feedback/packet detector 510 is $B_n = R_n$ and will be l×l. The $G_n$ "scalar" entries are the energies determined by an appropriate energy allocation scheme (for example, water-filling for each of the l excited inputs) to be used in connection with the input data $X_{l,n}$.

For the two-sided-case, both the receiver and transmitter become matrix multiplies on each tone so that coordination is then also needed on the transmit side (sometimes this configuration can work somewhat better when the spatial noise has special characteristics). The matrices for these matrix multiplies are determined for each tone independently by a "singular-value" factorization of the matrix $H_n$ so that $$H_n = F_n \cdot V_n \cdot M_n^* \quad (2)$$

where the $F_n$ matrix is k×k orthogonal, $V_n$ is a diagonal k×l matrix with zeroed entries to make it non-square when k≠n, and the $M_n$ matrix is l×l orthogonal. Again, such a computation might be done by a controller such as a dynamic spectrum manager in a DSM center or the like. Such a decomposition need not be square. The $H_n$ should include any prewhitening factor so this matrix is formed by multiplying the inverse of any square root of the measured noise spatial-autocorrelation matrix $S_n$ (this noise is all the noise from sources other than the (2K−1) lines) by the channel insertion loss matrix $Hlin_n$, so that $H_n = S_n^{-0.5} \cdot Hlin_n$. The receiver processing matrix is then $W_n = F_n \cdot S_n^{-0.5}$ and $B_n = 0$ (no feedback) while the transmitter now is a matrix multiply of a vector of inputs (one each tone) by $M_n^*$. The energies and number of bits applied to each of the vector inputs are again determined by some appropriate procedure like water-filling. In effect for one or two-sided vectoring, the water-filling is applied using the diagonally gains determined by the diagonal elements of $|V_n|^2$ for all the tones, so that effectively a water-filling procedure of up to (2K−1)·8192 subchannels for the K loops is executed to maximize the sum of the data rates on each of the lines (individual line power constraints as might occur in practice are handled by discrete loading procedures such as the well-known Levin-Campello procedures by maintaining a monitor for each line or wire's total power as bits are allocated to the various tones and wires in positions of least energy increase to see if any particular line exceeds its total power limit. When such a limit is exceeded all tones on that wire then will then have incremental energy tables updated to be very large (infinite) cost associated to putting any more bits on tones for that loop/wire.

For the one-sided case, a special precoded downstream transmitter (as in Chapter 11 of Starr et al.) can be used to remove FEXT between CPEs that are in different places but terminate on the same pedestal. However, more than k sources of NEXT and other noises cannot be eliminated, and there will likely be more than k sources if there are multiple users, because each and every wire of one customer is a potential crosstalk noise source for another customer's group of wires in that case. Such a situation might benefit from FDM rather than NEXT/echo-cancellation, as will be appreciated by those skilled in the art. NEXT and echo cancellation also can be done independently and simply for each tone in a digitally duplexed DMT system, as will be appreciated by those skilled in the art, but will not be shown in detail.

Vectoring is an especially useful tool where, as in the example of FIG. 3, all lines are coterminous at both ends and all signals on any of the 7 (2K−1) lines that are used (keeping in mind that not all 7 must be used) are sent/received by a single user CPE 325. The channel transfer matrix H can be determined with great precision as can the remaining non-crosstalk-noise power spectra. Moreover, despite being unshielded in many situations (for example, a drop from a neighborhood pedestal to a residential CPE), sources of interference that typically would be troublesome (for example, radio signals, RF interference and impulses generated by lighting or household appliances) are mitigated more effectively in the vectored receiver. Vectoring when the non-crosstalk-noise spectra are known can be used to eliminate up to (2K−1) independent sources of such noise, thus further enhancing the transmission capacity of the bonded set of loops.

Data-rate capacity can be further enhanced in some embodiments of the present invention by expanding the transmission frequency bandwidth for one or more of the channels in link 316. In many VDSL1 systems, the transmission spectrum has an optional maximum-usable frequency of approximately 17.664 MHz (with the default being only 8.8 MHz) while even ADSL2+ systems can use no more than 2.2 MHz of bandwidth. In some embodiments of the present invention, the transmit spectrum is increased to an upper bandwidth limit of approximately 35.328 MHz, for at least some of the wires 310.

Frequency-division-multiplexing (FDM), echo/NEXT cancellation or some combination of the two can be used to separate upstream and downstream transmission. Echo/NEXT cancellation will attain the highest data rates if there are less than (2K−1) sources of independent noise (that is not generated from any of the (2K−1) coordinated wires) in the drop segment (including drop upstream-into-downstream NEXT from other customers' upstream CVU transmitters in the same drop), because the full bandwidth is used in both up and down directions. FDM can be used and is simpler to implement when there is a concern about a surplus of other customers' crosstalk in the same drop segment. Assuming symmetric transmission, the data rates attainable with FDM are approximately 50% of the data rates attainable with NEXT/echo cancellation. Wires from loops 312 that normally would be theoretically considered or deemed reference wires (most DSLs are differentially transmitted and received; therefore, calling one of the two wires in a loop the "reference wire" is convenient for theoretical purposes and often done) and therefore would not carry any data (for example, wires 310-2, 310-4, 310-6 that would be the reference wires for loops 312-2, 312-3 and 312-4, respectively, in FIG. 3) can be used for data transport as well. These extra wires can be employed and combined in the bonded, vectored environment of system 300.

Those skilled in the art will note that the use of these extra wires is equivalent to the use of all the transverse electromagnetic modes of propagation in the transmission binder and, in particular, that the extra signals can sometimes be referenced between the average voltages between the two wires of a single pair with respect to the average voltages between the two wires of a different single pair, sometimes called "center to center" of the loops. These signals so referenced are called "phantoms." Actually, the use of the extra wires with the nomenclature explicitly described in embodiments of the present invention is mathematically equivalent to the phantom nomenclature, but often referred to as "split-pair" circuits. Split-pairs occasionally occur in DSL inadvertently (for example, a mistake made by technical field personnel), but can actually function. The fact that they do, in fact work in these unintentional implementations is an indication of their data carrying capability, fully exploited intentionally in embodiments of the present invention. While these split-pair (or "phantom") circuits may or may not be able to achieve data rates comparable to the other data-bearing wires in segment 305, they nevertheless can contribute to the link's data-rate (that is, the aggregate data-rate) for any CPE(s) on the downstream side of segment 305. As the line lengths become shorter and if the split-pair modes are intentionally well excited, the data-rates possible in these modes approach those of the normal modes. One aspect and benefit of the embodiments of the present invention is magnifying and expanding the data-carrying capability of the split-pair modes of transmission.

In the bonded environment of system 300, impedance matching at both ends of the wires 310 becomes considerably more complex as a result of the 7 channel transmission configuration and the crosstalking that exists between wires 310-1 through 310-7. While not essential to operation of the system 300, impedance matching can assist in achieving higher data rates. Consequently, a matrix impedance matching circuit (MIMC) 325 is in CVU 322 and another matching MIMC 327 is used in PVU 324. The MIMC ensures that minimal or no signal/energy is reflected at the wires' ends as a result of impedance imbalance. This impedance matching results in optimal use of available transmit power as well as eliminating potential interference by reflected data signals.

Figure 6:
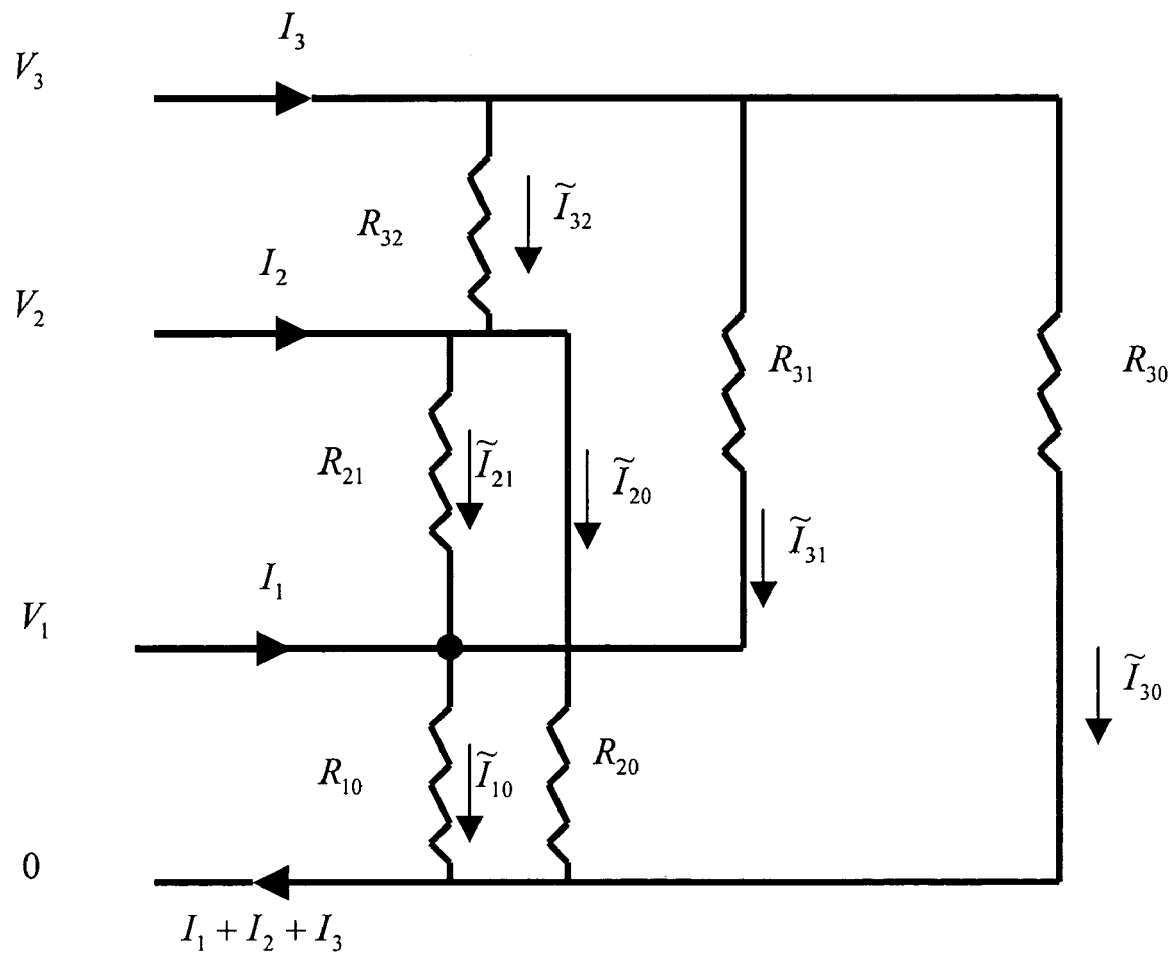
FIG. 6 is a schematic diagram illustrating the principles of a matrix impedance matching circuit implementable with one or more embodiments of the present invention.

An example of an MIMC, shown in FIG. 6, is a matrix matched circuit for 2 loops. Those skilled in the art will be able to extend the basic principles of this circuit to links of 3, 4, 5, etc. bonded lines. Essentially, a resistor is coupled to each pair of wires (in general, any complex impedance works, so each name can be changed to a Z; but in phone lines, it usually is a resistor). The resistance values are then computed from a matrix matched impedance as specified in T1E1.4 contribution number T1E1.4/2003-018R9 (Feb. 24, 2004—Dynamic Spectrum Management draft report). Further information regarding this technique may be found in Analysis of Multiconductor Transmission Lines (Paul; Clayton; Wiley: New York, 1994.

A $(2m-1)\times(2m\times 1)$ matrix resistance (for m loops bonded to provide 2m−1 data carrying lines), which would have 6 independent values and would have the relationship $$V = \begin{bmatrix} V_3 \\ V_2 \\ V_1 \end{bmatrix} = Z \cdot I = \begin{bmatrix} Z_{33} & Z_{32} & Z_{31} \\ Z_{32} & Z_{22} & Z_{21} \\ Z_{31} & Z_{21} & Z_{11} \end{bmatrix} \cdot \begin{bmatrix} I_3 \\ I_2 \\ I_1 \end{bmatrix} \quad (3)$$

The values in the Z matrix give no clue as to the resistors in the circuit of FIG. 6 upon first examination. However, maximum energy transfer occurs (when Z is real) when the matrix circuit of FIG. 6 has resistor values that maintain the relations between current and voltage in Equation (3).

The solution is derived by listing the 6 resistance values and the currents between them as shown in FIG. 6. In general, $$\tilde{I}_{ij} = \frac{1}{R_{ij}} \cdot [V_i - V_j] \quad (4)$$

for any wire i=1, ..., 2m−1 and any different j=1, ..., 2m−1 (so this extends to more than 4 wires directly). Then the matrix relationship $$I = \begin{bmatrix} 1 & 1 & 1 & 0 & 0 & 0 \\ -1 & 0 & 0 & 1 & 1 & 0 \\ 0 & -1 & 0 & -1 & 0 & 1 \end{bmatrix} \cdot \begin{bmatrix} \tilde{I}_{32} \\ \tilde{I}_{31} \\ \tilde{I}_{30} \\ \tilde{I}_{21} \\ \tilde{I}_{20} \\ \tilde{I}_{10} \end{bmatrix} = J \cdot \tilde{I} \quad (5)$$

can be illustrated by a 3×6 matrix J of 1's, 0's and −1's and extends in the straightforward manner to a $(2m-1)\times 2\cdot(2m-1)$ matrix. A second matrix relation derives from stacking the relations of Equation (4) into $$\tilde{I} = \begin{bmatrix} \frac{1}{R_{32}} & -\frac{1}{R_{32}} & 0 \\ \frac{1}{R_{31}} & 0 & -\frac{1}{R_{31}} \\ \frac{1}{R_{30}} & 0 & 0 \\ 0 & \frac{1}{R_{21}} & -\frac{1}{R_{21}} \\ 0 & \frac{1}{R_{20}} & 0 \\ 0 & 0 & \frac{1}{R_{10}} \end{bmatrix} \cdot \begin{bmatrix} V_3 \\ V_2 \\ V_1 \end{bmatrix} = \tilde{Y} \cdot V \quad (6)$$

and again easily extends to larger numbers of loops.

Finally, $I = J \cdot \tilde{Y} \cdot V$, so $$Y = J \cdot \tilde{Y}$$

$$= \begin{bmatrix} \frac{1}{R_{32}} + \frac{1}{R_{31}} + \frac{1}{R_{30}} & -\frac{1}{R_{32}} & -\frac{1}{R_{31}} \\ -\frac{1}{R_{32}} & \frac{1}{R_{32}} + \frac{1}{R_{21}} + \frac{1}{R_{20}} & -\frac{1}{R_{21}} \\ -\frac{1}{R_{31}} & -\frac{1}{R_{21}} & \frac{1}{R_{31}} + \frac{1}{R_{21}} + \frac{1}{R_{10}} \end{bmatrix}.$$

This set of equations can then be easily back-solved for the resistors, given Z, by the set of equations:

compute: $Y = Z^{-1}$ compute: $R_{2m-1,i} \times -1/Y_{2m-1,i}$ i=1, ..., 2m−2

$$R_{2m-1,0} = \left[ Y_{2m-1,2m-1} - \sum_{i=1}^{2m-2} \frac{1}{R_{2m-1,i}} \right]^{-1}$$

compute: $R_{i,j} = -1/Y_{2m-1,i}$ i=1, ..., j−1

$$R_{j,0} = \left[ Y_{j,j} - \sum_{i=1}^{2m-1} \frac{1}{R_{j,i}} \right]^{-1}$$

compute:

$$R_{1,0} = \left[ Y_{11} - \sum_{i=1}^{2m-1} \frac{1}{R_{1,i}} \right]^{-1}$$

Another embodiment of the present invention is shown in FIG. 4. In FIG. 4, operation of the PVU 424 and CVU 422, as well as other components, if desired, is controlled by a controller 490 that manages system 400. As seen in FIG. 4, controller 490 (for example, a dynamic spectrum manager and/or DSM center utilizing a computer system) is coupled to and communicates with the VUs 422, 424. CVU 422 includes an MIMC 425 coupled to the customer end of the segment 405. Appropriate filters 443 and an analog-to-digital/digital-to-analog converter 445 can also be coupled to the MIMC 425. A vector signal processing module 442 is coupled to the customer end of the segment 405 as well. The vector signal processing module 442 can be a computer, integrated circuit (or "chip") or other suitable device for processing signals received and/or transmitted on the segment 405. In the embodiment of the present invention shown in FIG. 4, module 442 is coupled to the vectoring control means 492 of controller 490, which assists in regulating (for example, one-sided and/or two-sided vectoring) transmissions across the segment and can provide control information and instructions (for example, coefficients used in signal processing for one-sided and/or two-sided vectoring).

Similarly, PVU 424 includes an MIMC 427 coupled to the pedestal end of the segment 405. Appropriate filters 446 and an analog-to-digital/digital-to-analog converter 447 can also be coupled to the MIMC 427. A vector signal processing module 444 is coupled to the pedestal end of the segment 405 as well. Module 444 can be a computer, integrated circuit, chip or other suitable device for processing signals received and/or transmitted on the segment 405. In the embodiment of the present invention shown in FIG. 4, module 444 is coupled to the vectoring control means 492 of controller 490, which can provide control information and instructions (for example, coefficients used in signal processing for one-sided and/or two-sided vectoring). Modules 442, 444 may also be implemented as part of the controller 490 or be located somewhere other than inside their respective VUs, as will be appreciated by those skilled in the art.

In some embodiments of the present invention, the controller 490 may communicate with a remote location, such as downstream VU 422, via the link 416 rather than directly. Also, the controller 490 may be coupled to the CPE(s) 432 and/or CO(s) 434, if desired, which link may be used for communicating with the respective VUs. Those skilled in the art will appreciate that communication with the VUs can be accomplished in a variety of ways using various types of links (including, for example, the DSL system itself, email, ftp (file transfer program) over the internet, or some other "external" communication means, etc.). One practical partitioning is for a remote controller (for example a DSM center) to collect the data from initialization and operations that can be used to construct the H matrix describing the matrix channel, analyze noise, and then make decisions on the appropriate vectors to be used by the VUs. In this way a remote capability for such computationally intensive functions and determinations could be shared (rather than embedding this function at the VU location where power, memory, computation and cost are at a premium).

Controller 490 includes segment monitoring means 496, which collects data regarding operation of the system 400 and may provide this data to a history module 495, such as a database. Vectoring control means 492 uses this data to generate control signals sent to the vector signal processing modules 442, 444 for VUs 422, 424, respectively. These vectoring control signals provide information on the bit distributions, margins, transmission power levels and other operational information needed to operate the vectored system 400 properly (for example, at the highest aggregate data rate available within any given constraints). Again, this can include what mode of vectoring to use (for example, one-sided or two-sided, as described above) and coefficients and other data needed to process signals for segment 405.

Controller 490 also may include a frequency bandwidth control means 494, which generates frequency bandwidth control signals used by the VUs 422, 424 to determine what frequency bandwidths will be used for communication on link 416. In generating their respective control signals, both means 492, 494 may consult or otherwise utilize historical performance and operational data in a library module 495 or the like. As noted above, module 495 might take the form a database coupled to a computer system. Means 492, 494, 496 can be implemented as software, hardware or a combination of both software and hardware (for example, one or more computer systems and/or integrated circuits), as will be appreciated by those skilled in the art.

A controller implementing one or more embodiments of the present invention can be a dynamic spectrum manager or spectrum management center and can be a computer-implemented device or combination of devices that monitors the appropriate system 400 and data relating thereto. The controller may directly or indirectly dictate/require changes in the operation of system 400 by users and/or equipment coupled to the controller or may only recommend changes. In some embodiments, upstream VUs to which the controller is coupled may all reside in the same location (for example, a DSL central office) and may or may not share other resources for their respective transmission channels. The structure, programming and other specific features of a controller usable in connection with embodiments of the present invention will be apparent to those skilled in the art after reviewing the present disclosure.

The controller can reside in one or more locations, as will be appreciated by those skilled in the art. For example, the controller may reside in the CO with to which a CPE is coupled. Moreover, in some embodiments, the controller may reside in a pedestal or other intermediate location within the DSL plant. Finally, the controller may reside in the CPE (for example, in a user-side transceiver, modem or the like).

Thus, embodiments of the present invention provide substantial improvements in data rate for short length DSL systems where multiple loops are available for bonding and vectoring, or other coordination that provides similar functionalities. In the exemplary systems of FIGS. 3 and 4, the 4 loops would individually be able to achieve rates of approximately 150 Mbps per loop, yielding an aggregate data rate to the CPE(s) of approximately 600 Mbps over the 4 loops. Using one of the 7 channel bonded and vectored configurations of FIGS. 3 and 4, rates of over 1,000 Mbps (1 Gbps) can be realized—an increase of over 65%.

FIG. 7 provides data from testing using line lengths varying from 50 meters to 300 meters and various combinations of frequency bandwidth and wire/channel dimensions. As can be seen from the data presented in FIG. 7, none of the rates fell below 900 Mbps. As would be expected, using all available channels (the 7×7 channel instances) produces the best results, none falling below 1.38 Gbps. This data can be contrasted with high speed (1 Gbps or more) Ethernet systems using 4 loops. The 4 loops are used as four channels with NEXT cancellation, but no vectoring or handling of FEXT, with 5-level PAM transmission at 125 MHz symbol rate (250 Mbps per loop) on each of the 4 wires. Actually, this works to 1.25 Gbps, but the extra 0.25 Gbps is internal overhead (normally 4 levels is enough with no overhead). There are no bridged taps and noise is reduced by much tighter twisting of the Cat5, Cat53, Cat6 cables that abound in high speed Ethernet. The maximum range in such systems is 100 meters. Moreover, the present invention uses extra modes, more efficient adaptive DMT, synchronizing so that each tone is individual vectored system, and exploiting of the FEXT and split-pairs, and lines of 300 meters plus on much inferior grade wiring for the same number of pairs.

Generally, embodiments of the present invention employ various processes involving data stored in or transferred through one or more computer systems. Embodiments of the present invention also relate to a hardware device or other apparatus for performing these operations. This apparatus may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform the required method steps. A particular structure for a variety of these machines will be apparent to those of ordinary skill in the art based on the description given below.

Embodiments of the present invention as described above employ various process steps involving data stored in computer systems. These steps are those requiring physical manipulation of physical quantities. Usually, though not necessarily, these quantities take the form of electrical or magnetic signals capable of being stored, transferred, combined, compared and otherwise manipulated. It is sometimes convenient, principally for reasons of common usage, to refer to these signals as bits, bitstreams, data signals, control signals, values, elements, variables, characters, data structures or the like. It should be remembered, however, that all of these and similar terms are to be associated with the appropriate physical quantities and are merely convenient labels applied to these quantities.

Further, the manipulations performed are often referred to in terms such as identifying, fitting or comparing. In any of the operations described herein that form part of the present invention these operations are machine operations. Useful machines for performing the operations of embodiments of the present invention include general purpose digital computers or other similar devices. In all cases, there should be borne in mind the distinction between the method of operations in operating a computer and the method of computation itself. Embodiments of the present invention relate to method steps for operating a computer in processing electrical or other physical signals to generate other desired physical signals.

Embodiments of the present invention also relate to an apparatus for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various computer-implemented operations. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 8:
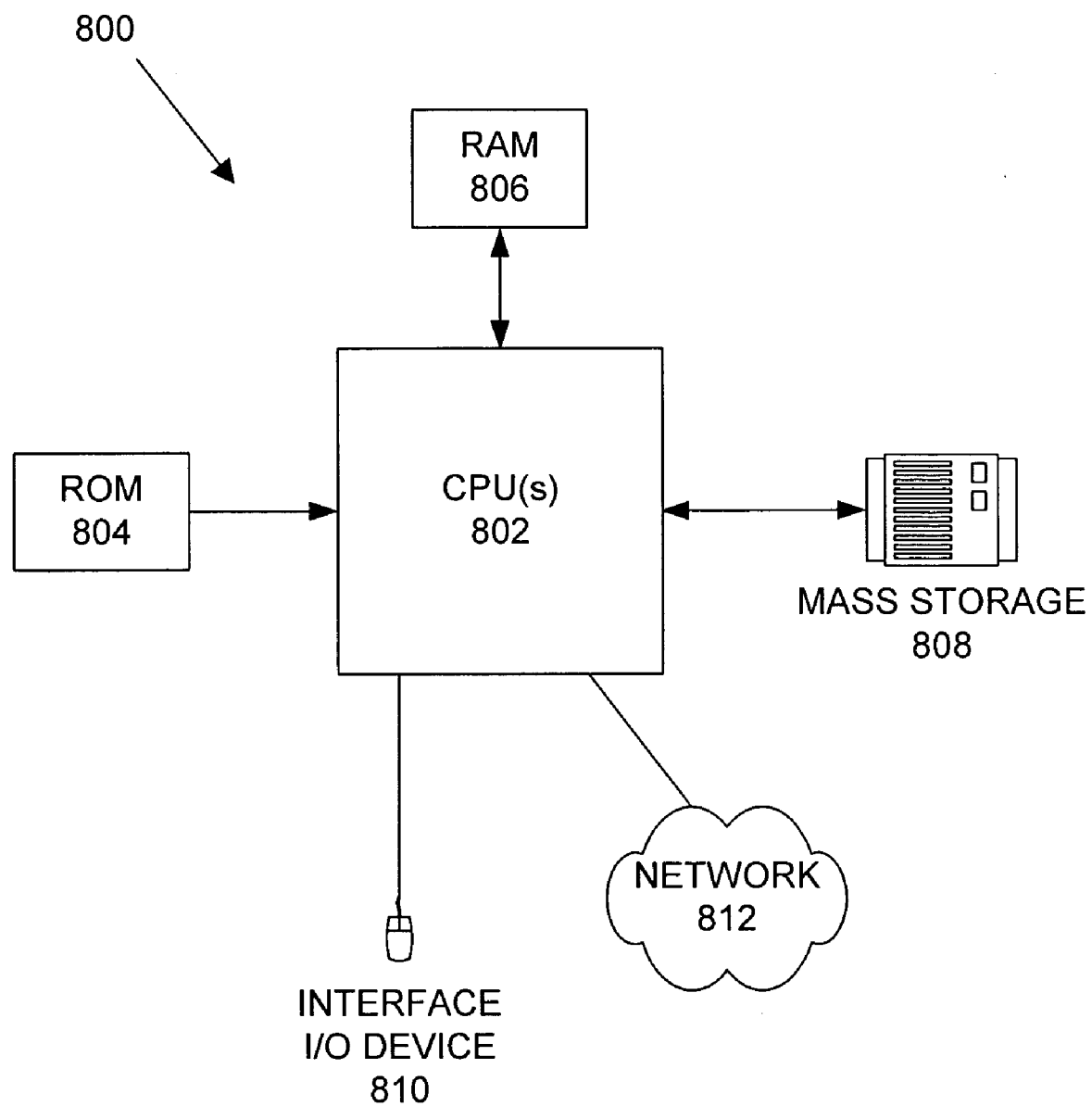
FIG. 8 is a block diagram of a typical computer system suitable for implementing embodiments of the present invention.

FIG. 8 illustrates a typical computer system that can be used by a user and/or controller in accordance with one or more embodiments of the present invention. The computer system 800 includes any number of processors 802 (also referred to as central processing units, or CPUs) that are coupled to storage devices including primary storage 806 (typically a random access memory, or RAM), primary storage 804 (typically a read only memory, or ROM). The CPU and some of the components of system 800 may also be implemented as an integrated circuit or chip that is a single device capable of being used in embodiments of the present invention. As is well known in the art, primary storage 804 acts to transfer data and instructions uni-directionally to the CPU and primary storage 806 is used typically to transfer data and instructions in a bi-directional manner. Both of these primary storage devices may include any suitable of the computer-readable media described above. A mass storage device 808 also is coupled bi-directionally to CPU 802 and provides additional data storage capacity and may include any of the computer-readable media described above. The mass storage device 808 may be used to store programs, data and the like and is typically a secondary storage medium such as a hard disk that is slower than primary storage. It will be appreciated that the information retained within the mass storage device 808, may, in appropriate cases, be incorporated in standard fashion as part of primary storage 806 as virtual memory. A specific mass storage device such as a CD-ROM 814 may also pass data uni-directionally to the CPU.

CPU 802 also is coupled to an interface 810 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 802 optionally may be coupled to a computer or telecommunications network using a network connection as shown generally at 812. With such a network connection, it is contemplated that the CPU might receive information from the network, or might output information to the network in the course of performing the above-described method steps. The above-described devices and materials will be familiar to those of skill in the computer hardware and software arts. The hardware elements described above may define multiple software modules for performing the operations of this invention. For example, instructions for running a codeword composition controller may be stored on mass storage device 808 or 814 and executed on CPU 802 in conjunction with primary memory 806. In a preferred embodiment, the controller is divided into software submodules.

Examples have been provided herein using 4096 and/or 8192 tones in the frequency bandwidth of a DMT system. As will be appreciated by those skilled in the art, other frequency bandwidth spectra may be used, including wider bands of frequencies. Moreover, in some systems NEXT/echo cancellation may be used, while in other exemplary systems FDM is used. Again, as those skilled in the art will appreciate, one technique may be more advantageous than the another and/or have drawbacks relative to the other (for example, FDM's lower data rate relative to NEXT/echo cancellation techniques).

The many features and advantages of the present invention are apparent from the written description, and thus, the appended claims are intended to cover all such features and advantages of the invention. Further, since numerous modifications and changes will readily occur to those skilled in the art, the present invention is not limited to the exact construction and operation as illustrated and described. Therefore, the described embodiments should be taken as illustrative and not restrictive, and the invention should not be limited to the details given herein but should be defined by the following claims and their full scope of equivalents, whether foreseeable or unforeseeable now or in the future.

What is claimed is:

1. A DSL (Digital Subscriber Line) system comprising:
   a multiple loop segment comprising a plurality of bonded loops, each loop comprising a twisted pair of wires, the loops being coupled at one end to a controller and at the other end, opposite the controller, to a plurality of different customer premises equipments (CPEs) that are in different locations to provide at least one DSL communications channel to each respective CPE, there being at least one loop coupled to each CPE;

the controller to monitor the multiple loop segment and to generate control signals based on the monitoring; and a vectoring unit also coupled to a plurality of the loops of the multiple loop segment at the controller end of the multiple loop segment, to receive the control signals and to vector transmissions simultaneously through the coupled plurality of the loops of the multiple loop segment, the coupled plurality of the loops being coupled to different CPEs, wherein for at least one CPE, a plurality of twisted pairs of wires are coupled to the CPE such that one wire of the plurality of twisted pairs of wires is selected as a reference wire and the other wires of the plurality of twisted pairs of wires are referenced to the reference wire to provide more communications channels than there are twisted pairs.

2. The DSL system of claim 1, wherein the control signals are used to operate the multiple loop segment as a vectored system across all loops of the multiple loop segment that carry active communications channels.

3. The DSL system of claim 1, wherein the vectoring unit comprises a pedestal vectoring unit (PVU) and wherein the PVU vectors transmissions to and from the CPEs using the control signals.

4. The DSL system of claim 3, wherein the PVU is in a pedestal.

5. The DSL system of claim 4, wherein the PVU comprises a vector signal processing module and wherein the controller comprises a vectoring control means coupled to the vector signal processing module.

6. The DSL system of claim 3, further comprising a customer vectoring unit (CVU) at the CPE and coupled to the controller to vector transmissions to and from the CPEs.

7. The DSL system of claim 6, wherein the PVU is in a first pedestal and the CVU is in a second pedestal.

8. The DSL system of claim 1, wherein at least one of the communication channels is operated using an expanded frequency spectrum.

9. The DSL system of claim 1, wherein the controller comprises a frequency bandwidth controlling means used in transmitting data across the multiple loop segment.

10. The DSL system of claim 1, wherein the controller is a dynamic spectrum manager comprising vectoring control means.

11. The DSL system of claim 10, wherein the controller comprises a computer system.

12. The DSL system of claim 1, further comprising a first impedance matching circuit coupled to a first end of the multiple loop segment and a second impedance matching circuit coupled to a second end of the multiple loop segment.

13. The DSL system of claim 12, further comprising placing an impedance between each wire and each other wire.

14. The DSL system of claim 1, wherein the DSL system is one of an ADSL (Asymmetric DSL) system and a VDSL (Very High Bit Rate DSL) system.

15. The DSL system of claim 1, wherein the loops are bonded using one of the following bonding protocols: TDIM (Time Division Inverse Multiplexing) bonding; Ethernet bonding; ATM (Asynchronous Transfer Mode) bonding; or the G.bond protocol.

16. The DSL system of claim 1, wherein the plurality of twisted pairs number K twisted pairs so that there are 2K wires in the segment, one of the 2K wires being selected as a reference wire, the remaining (2K−1) wires being referenced to the reference wire to provide up to (2K−1) communications channels, the (2K−1) channels using vectoring across the channels.

17. A DSL (Digital Subscriber Line) system comprising:
a multiple loop segment comprising a plurality of bonded loops, each loop in the multiple loop segment having a pair of wires, the segment being coupled at a first end to a plurality of different customer premises equipments (CPEs) to provide different channels to different CPEs that are in different locations, the wires of the multiple loop segment being connected so that at least two wires of the multiple bonded loops each carry a communication channel using a third wire of the multiple bonded loops as a common reference wire, a first vectoring unit coupled at the first end of the multiple loop segment resident at one of the CPEs of the plurality of different CPEs, the first vectoring unit comprising a first vector signal processing module; and a second vectoring unit coupled to a plurality of the loops of the multiple loop segment at a second end opposite the first end of the multiple loop segment opposite the plurality of CPEs and comprising a second vector signal processing module;

wherein the first and second vectoring units provide vectored transmissions across the multiple loop segment, the second vectoring unit vectoring upstream and downstream transmissions with the plurality of CPEs simultaneously across all active channels of the coupled plurality of the loops of the segment across different CPEs.

18. The DSL system of claim 17, further comprising a controller coupled to the second end of the multiple loop segment and to the first and second vectoring units, the controller comprising vectoring control means to assist in regulating transmissions across the multiple loop segment.

19. The DSL system of claim 18, wherein the controller is a dynamic spectrum manager.

20. The DSL system of claim 18, wherein the controller further comprises frequency bandwidth control means for regulating the frequency bandwidth used in transmissions across the multiple loop segment.

21. The DSL system of claim 17, wherein the first vectoring unit is in a first pedestal and further wherein the second vectoring unit is in a second pedestal.

22. The DSL system of claim 17, wherein the first vectoring unit is in a customer premises and further wherein the second vectoring unit is in a pedestal.

23. The DSL system of claim 17, further comprising a first impedance matching circuit coupled to the first end of the multiple loop segment and a second impedance matching circuit coupled to the second end of the multiple loop segment.

24. A DSL (Digital Subscriber Line) system comprising:
a multiple loop segment, comprising a plurality of bonded loops, each loop in the multiple loop segment having a pair of wires, the wires being connected as communication channels to a plurality of different customer premises equipments (CPEs) coupled to one end of the multiple loop segment to provide different channels to different CPEs that are in different locations, the wires in each loop being connected so that at least two wires of the multiple bonded loops each carry a communication channel using a third wire of the multiple bonded loops as a common reference wire; and a controller coupled opposite the plurality of different CPEs, the controller comprising:

means for collecting data regarding transmissions across the communications channels of the multiple loop segment; and means for controlling vectoring of transmissions across the communications channels of the multiple loop segment to vector upstream and downstream transmissions with the plurality of CPEs simultaneously across all active channels of the communications channels of the coupled plurality of the loops of the segment.

25. The DSL system of claim 24, further comprising a vector signal processing module coupled to the controller and opposite the plurality of different CPEs to perform vectoring of the transmissions in response to the controller.

26. The DSL system of claim 25, further comprising a first impedance matching circuit coupled between a first end of the multiple loop segment and the CPEs and a second impedance matching circuit coupled between a second end of the multiple loop segment and the vector signal processing module.

27. The DSL system of claim 26, further comprising a second vector signal processing module coupled to the first impedance matching circuit resident at one of the plurality of different CPEs.

28. The DSL system of claim 24, wherein the multiple loop segment couples customer premises equipment to a pedestal.

29. The DSL system of claim 24, wherein the multiple loop segment couples a first pedestal to a second pedestal.

30. A method of sending DSL (Digital Subscriber Line) signals through multiple communication channels comprising:
    sending a first signal through a first communications channel to a first customer premises equipment (CPE), wherein the first communication channel comprises a plurality of twisted pairs from a multiple loop segment numbering K bonded twisted pairs so that there are 2K wires in the segment, one of the 2K wires being selected as a reference wire, the remaining (2K–1) wires being referenced to the reference wire to provide up to (2K–1) communications channels, the (2K–1) channels using vectoring across the channels;
    sending a second signal through a second communications channel to a second CPE at a different location using a second at least two wires of the same multiple loop segment; and
    vectoring upstream and downstream transmissions through the first and second communications channels simultaneously across the first and second communications channels and the first and second CPEs from an upstream location coupled to the first and second communications channels opposite the CPEs.

31. The method of claim 30, wherein vectoring comprises one-sided vectoring from the location opposite the CPEs.

32. The method of claim 30, wherein vectoring transmissions across the multiple loop segment comprises two-sided vectoring.

33. The method of claim 30, further comprising collecting data regarding transmissions across the multiple loop segment and providing vectoring control signals to a vectoring unit of the multiple loop segment based on the monitoring.

34. A computer-readable storage medium having instructions stored thereon, that when executed by a computer causes the computer to perform operations comprising:
    collecting data regarding DSL (Digital Subscriber Line) transmissions on a plurality of loops of a multiple loop segment, each loop having a pair of wires to carry transmissions to customer premises equipment (CPE), the plurality of loops forming a plurality of communications channels to a plurality of different CPEs at different locations, at least one channel comprising a plurality of twisted pairs from a multiple loop segment numbering K bonded twisted pairs so that there are 2K wires in the segment, one of the 2K wires being selected as a reference wire, the remaining (2K–1) wires being referenced to the reference wire to provide up to (2K–1) communications channels, the (2K–1) channels using vectoring across the channels; and
    generating control signals to simultaneously control vectoring of the transmissions across the plurality of loops with the plurality of different CPEs across different communications channels of the coupled plurality of loops of the segment.

35. The medium of claim 34, wherein the operations further comprise providing the control signals to a vectoring unit to vector upstream and downstream transmissions across the different communication channels.

36. The medium of claim 34, wherein the operations further comprise generating control signals to control the frequency bandwidth used in transmitting data across the different communication channels.

* * * * *

UNITED STATES PATENT AND TRADEMARK OFFICE
CERTIFICATE OF CORRECTION

PATENT NO.       : 7,639,596 B2
APPLICATION NO.  : 10/808771
DATED            : December 29, 2009
INVENTOR(S)      : John M. Cioffi Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1113 days.

Signed and Sealed this

Ninth Day of November, 2010

David J. Kappos
*Director of the United States Patent and Trademark Office*